United States Patent [19]
Tanizaki

[11] Patent Number: 6,038,186
[45] Date of Patent: Mar. 14, 2000

[54] SEMICONDUCTOR MEMORY DEVICE THAT CAN HAVE POWER CONSUMPTION REDUCED DURING SELF REFRESH MODE

[75] Inventor: Tetsushi Tanizaki, Hyogo, Japan

[73] Assignee: Mitsubishi Denki Kabushiki Kaisha, Tokyo, Japan

[21] Appl. No.: 09/064,834

[22] Filed: Apr. 23, 1998

[30] Foreign Application Priority Data

Sep. 12, 1997 [JP] Japan .................................. 9-248466

[51] Int. Cl.[7] ................................................ G11C 7/00
[52] U.S. Cl. ...................... 365/222; 365/226; 365/203; 365/189.11
[58] Field of Search .................. 365/203, 222, 365/189.11, 207, 228, 226

[56] References Cited

U.S. PATENT DOCUMENTS

| | | | |
|---|---|---|---|
| 5,412,604 | 5/1995 | Fukuda et al. .................. | 365/189.11 |
| 5,418,753 | 5/1995 | Seki ........................... | 365/222 |
| 5,644,544 | 7/1997 | Mizukami ..................... | 365/222 |

FOREIGN PATENT DOCUMENTS 7-85658  3/1995  Japan .

*Primary Examiner*—David Nelms
*Assistant Examiner*—Thong Le
*Attorney, Agent, or Firm*—McDermott, Will & Emery

[57] ABSTRACT

In a self refresh mode, a precharge potential generation circuit provides a potential of a level that is lower than ½ the internal power supply potential level. An internal drive circuit provides the level of the internal power supply potential in a self refresh mode as the level of the signal to specify selective coupling between a sense amplifier and a bit line pair that takes a shared sense amplifier structure. The self refresh cycle time can be increased to lower the charging current of the bit line.

10 Claims, 13 Drawing Sheets

SEMICONDUCTOR MEMORY DEVICE THAT CAN HAVE POWER CONSUMPTION REDUCED DURING SELF REFRESH MODE

BACKGROUND OF THE INVENTION

1. Field of the Invention

The present invention relates to semiconductor memory devices, and more particularly, to a semiconductor memory device that can operate in a self refresh mode.

2. Description of the Background Art

In the field of semiconductor memory devices, the data retain time for retaining data written in a memory cell has become shorter as the integration density of semiconductor memory devices, particularly a dynamic RAM (referred to as DRAM hereinafter), is increased.

The increased scale of integration of the DRAM results in reduction of the capacitance per se of the memory cell capacitor, so that the effect of leakage current and the like that destroys the retain data can no longer be neglected.

In a DRAM, the operation of rewriting the retain data into each memory cell again, i.e., the refresh operation, must be carried at a constant interval.

Degradation in the data retain time of a memory cell means that the cycle time period of carrying out a refresh operation must be shortened. In other words, the number of refresh operations carried out within a constant time period is increased. This will cause greater power to be consumed.

When a DRAM is operated in a data retain mode in which backup is implemented by a battery, the refresh address and refresh actuation signal are generated within the DRAM to carry out a refresh operation. This is called a self refresh operation.

However, the potential level of the pair of bit lines BL and /BL connected to a memory cell belonging to a corresponding row in a memory cell array is generally precharged to ½ the internal power supply potential Vcca when the word line provided for every row of memory cells is inactive.

More specifically, a structure is provided in which readout can be carried out equally for data of an H level (logical high) or an L level (logical low) from a memory cell after a word line WL is activated since the potential level of bit lines BL and /BL is precharged to the potential of ½ Vcca.

This operation of precharging the potential level of the bit line pair to the level of ½ Vcca is also carried out in the above-described self refresh mode. In a self refresh mode, the refresh cycle is set longer than that of a normal operation to reduce the refresh operating current for a lower power consumption.

In other words, the cycle of a self refresh operation is determined relative to the refresh characteristic of a memory cell. If the cycle of the self refresh operation is set too long, the readout margin of an H level data is reduced. This will cause the error of a memory cell in which an H level is formerly written is altered to data of an L level.

It has become difficult to achieve sufficient capacitor capacitance since smaller memory cells are implemented to comply with the larger capacity of a DRAM. Accordingly, the refresh characteristic of a memory cell has become more severe. Under the present circumstances, it is difficult to reduce power consumption by increasing the cycle of the self refresh operation.

FIG. 10 is a schematic block diagram showing a structure of a conventional DRAM 2000.

Referring to FIG. 10, DRAM 2000 includes control signal input terminals 1002–1006, an address signal input terminal group 1008, a data signal input terminal group 1016, a ground terminal line 1018, and a power supply terminal 1020.

DRAM 2000 includes a clock generation circuit 1022, a row and column address buffer 1024, a row decoder 1026, a column decoder 1028, a memory mat 1023, a data input buffer 1040, and a data output buffer 1042. Memory mat 1032 includes a memory cell array 1034, and a sense amplifier+input/output control circuit 1038.

Clock generation circuit 1022 selects a predetermined operation mode according to a row address strobe signal EXT./RAS and a column address strobe signal EXT./CAS that are applied via control signal input terminals 1002 and 1004 to control the overall operation of DRAM 2000.

Row and column address buffer 1024 generates row address signals RA0–RAi and column address signals CA0–CAi according to externally applied address signals A0–Ai (where i is a natural number) via address signal input terminal group 1008. The generated signals RA0–RAi and CA0–CAi are provided to row decoder 1026 and column decoder 1028, respectively.

Memory mat 1032 includes a plurality of memory cells. Each memory cell stores data of one bit. Each memory cell is arranged at a predetermined address determined by the row address and column address.

Row decoder 1026 specifies a column address of memory cell array 1034. Sense amplifier+input/output control circuit 1038 connects the memory cell addressed by row decoder 1026 and column decoder 1028 to one end of a data signal input/output line pair IOP. Data signal input/output line pair IOP has the other end connected to data input buffer 1040 and data output buffer 1048.

In a writing mode, data input buffer 1040 responds to an external signal EXT./WE applied via signal control input terminal 1006 for providing the data input through data signal input terminal group 1016 to a selected memory cell via data signal input/output line pair IOP.

In a readout mode, data output buffer 1042 provides the data read out from a selected memory cell to data input/output terminal group 1016.

Power supply circuit 1050 receives external power supply potential Vcc and ground potential Vss to supply various internal power supply potentials required for an operation of DRAM 2000.

More specifically, power supply circuit 1050 includes an internal power supply circuit 1054 receiving an external power supply potential Vcc and ground potential Vss for providing internal power supply potentials Vcca and Vccp which are down-converted version of external power supply potential Vcc, and a boosted potential Vpp (Vcca<Vccp<Vcc<Vpp), and a precharge potential generation circuit 1052 for supplying a precharge potential Vbl corresponding to a bit line pair included in memory cell array 1034.

The internal power supply potential Vcca is supplied to memory cells. The internal power supply potential Vccp is supplied to the peripheral circuitry of DRAM 2000.

FIG. 11 is a circuit diagram showing a structure of precharge potential generation circuit 1052 in DRAM 2000 of FIG. 10.

Precharge potential generation circuit 1052 has its operation activated in response to activation of a signal /ACT (transition to an L level) from clock generation circuit 1022.

Precharge potential generation circuit 1052 includes a P channel MOS transistor 5102 receiving internal power supply potential Vcca at its source and rendered conductive according to activation of signal /ACT, a resistor 5104 and an N channel MOS transistor 5106 connected in series between a drain of P channel MOS transistor 5102 and a node Nn, and a resistor 5108 and an N channel MOS transistor 5110 connected in series between node Nn and ground potential.

N channel MOS transistor 5106 and N channel MOS transistor 5110 are diode-connected so that respective internal power supply potentials Vcca are in the forward direction towards the ground potential.

Precharge potential generation circuit 1052 further includes a P channel MOS transistor 5112 and a resistor 5114 connected in series between a drain of P channel MOS transistor 5102 and a node Np, and a P channel MOS transistor 516 and a resistor 5188 connected in series between node Np and ground potential.

P channel MOS transistor 5112 and P channel MOS transistor 5116 are diode-connected so that respective internal power supply potentials Vcca are in the forward direction towards the ground potential.

Precharge potential generation circuit 1052 further includes an N channel MOS transistor 5120 and a P channel MOS transistor 5112 connected in series between internal power supply potential Vcca and ground potential via a node Nc.

N channel MOS transistor 5120 has its gate receive a gate potential of N channel MOS transistor 5106. P channel MOS transistor 5122 has its gate receive a gate potential of P channel MOS transistor 5116.

Here, it is assumed that the resistance of resistors 5104 and 5108 and the resistance of resistors 5114 and 5118 are set to be respectively equal to each other.

Also, it is assumed that the characteristics of N channel MOS transistors 5106, 5110 and 5120 and the characteristics of P channel MOS transistors 5112, 5116 and 5122 are respectively set equal.

Therefore, the potential level of node N2 is ½ internal power supply potential Vcca. In other words, the gate potential of N channel MOS transistor 5106 is biased so that the source attains the potential level of node Nn.

Similarly, the potential level of node Np is ½ internal power supply potential Vcca. In other words, the gate potential of P channel MOS transistor 5116 is biased so that the source attains the potential level of node Np.

More specifically, N channel MOS transistor 5120 and P channel MOS transistor 5122 have their gates biased so that the potential level of respective connection nodes Nc is ½ internal power supply potential Vcca.

Thus, control is provided so that the potential of node Nc is ½ internal power supply potential Vcca.

This potential level of ½ internal power supply potential Vcca is supplied as the precharge potential level VBL of the bit line pair.

FIG. 12 is a circuit block diagram showing in detail a structure of one memory cell column with a portion omitted according to the structure of DRAM 2000 shown in FIG. 10.

For the sake of simplification, a structure is provided in which only a memory cell MC1 is connected to bit line BL and only a memory cell MC2 is connected to bit line /BL in FIG. 12.

Memory cell MC1 includes a memory cell transistor MT1 and a memory cell capacitor CP1.

Cell plate potential Vcp from power supply circuit 1050 is supplied to one terminal of memory cell capacitor Cp1.

The connection between the other terminal of memory cell capacitor CP1 and a corresponding bit line is opened/closed by a memory cell transistor MT1 that has its gate potential level controlled by a word line WLn.

Memory cell MC2 basically has a structure similar to that of memory cell MC1.

Here, the potential level of ½ Vcca is generally employed as cell plate potential Vcp.

A transistor TQ3 having its gate potential level controlled by a bit line equalize signal BLEQ is provided between bit lines BL and /BL. A transistor TQ1 is connected between a supply interconnection LVB of bit line precharge potential VBL and bit line BL. Also, a transistor TQ2 is connected between interconnection LVB and bit line /BL. Transistors TQ1 and TQ2 have their gate potentials controlled by signal BLEQ.

When signal BLEQ is rendered active under control of clock generation circuit 1022, the potentials of bit lines BL and /BL are equalized to an equal value by transistor TQ3. This potential will be maintained at the value of bit line precharge potential $V_{BL}$.

Following this equalize operation of a bit line pair, a data readout operation or a self refresh operation is carried out.

As disclosed in Japanese Patent Laying-Open No. 7-85658, the refresh characteristic of a memory cell can be improved by setting the value of this precharge potential level $V_{BL}$ lower than that of a normal operation mode in a self refresh operation mode.

The reason thereof will be described briefly hereinafter.

More specifically, the relationship between the readout margin of an H level data and bit line precharge potential $V_{BL}$ in a readout operation is evaluated as set forth in the following.

It is assumed that the internal power supply potential supplied to a memory cell array is Vcca, the bit line floating capacitance accompanying a bit line is Cb, the capacitance of a memory cell capacitor is Cs, and the cell plate potential is Vcp.

When an L level data is written into a memory cell capacitor, the charge $Q_{SL}$ accumulated in the memory cell capacitor is represented by the following equation.

$$Q_{SL}=-\text{Cs VCP} \ldots \quad (1)$$

When an H level data is written, charge $Q_{SH}$ accumulated in the memory cell capacitor is represented by the following equation.

$$Q_{SH}=\text{Cs(Vcca-Vcp)} \ldots \quad (2)$$

Charge Qb accumulated in a precharged bit line is represented by the following equation.

$$Qb=CbV_{BL} \quad (3)$$

According to the above relationship, the amount of change in the bit line voltage (read out voltage ΔV) at conduction of a memory cell transistor MT (transfer gate) when data of an L level is stored in a memory cell capacitor is expressed as below.

$$\Delta V_L=-V_{BL}/(1+Cb/Cs) \quad (4)$$

When data of an H level is stored in the memory cell capacitor, the amount of change in the bit line voltage is represented as below.

$$\Delta V_H=(Vcc-V_{BL})/(1+Cb/Cs) \quad (5)$$

Referring to equations (1)–(5), the read out voltage $\Delta V_L$ of an L level is equal to the absolute value of readout voltage $\Delta V_H$ at the read out of an H level data when bit line precharge potential $V_{BL}$ is ½ Vcca. Therefore, the following relationship is established.

$$|\Delta V_L|=|\Delta V_H| \qquad (6)$$

When bit line precharge potential $V_{BL}$ is smaller than internal power supply potential ½ Vcca, the following relationship is established.

$$|\Delta V_L|<|\Delta V_H| \qquad (7)$$

In other words, the margin in the read out operation of an H level is increased by setting bit line precharge potential $V_{BL}$ lower than ½ internal power supply potential Vcca.

Since reduction in the read out margin due to a smaller capacitance of a memory cell capacitor generally implies degradation in the margin in reading out data of an H level, the margin in a read out operation is increased by the lower bit line precharge potential $V_{BL}$.

This means that the self refresh cycle time can be increased in a self refresh mode operation. More specifically, power consumption can be reduced.

However, it is difficult to achieve sufficient reduction in power consumption by just setting bit line precharge potential $V_{BL}$ smaller than ½ internal power supply potential Vcca.

FIG. 13 is a timing chart for describing the potential level of a bit line pair over time in a readout operation or a self refresh operation.

In the timing chart of FIG. 13, the dotted line corresponds to bit line precharge potential $V_{BL}$ at the level of ½ internal power supply potential Vcca, and the solid line corresponds to bit line precharge potential $V_{BL}$ at a level lower than ½ internal power supply potential Vcca.

As described above, the readout margin itself for data of an H level can be increased by setting bit line precharge potential $V_{BL}$ lower than ½ internal power supply potential Vcca. However, the potential level of the bit line that swings to the H level, for example bit line BL, shows a transition from the level of the precharge potential $V_{BL}$ (Vcca/2) to the level of internal power supply potential Vcca.

This means that a greater charging current must be applied to bit line BL than the case where bit line precharge potential $V_{BL}$ is at the level of potential Vcca/2.

There is a possibility that the power consumption reduction during self refresh is not sufficient even when the readout margin is increased by setting bit line precharge potential $V_{BL}$ lower than 1/1 internal power supply potential Vcca to allow the self refresh cycle time to be increased.

SUMMARY OF THE INVENTION

In view of the foregoing, an object of the present invention is to provide a semiconductor memory device that can have power consumption reduced in a self refresh mode.

According to an aspect of the present invention, a semiconductor memory device having a self refresh mode includes a first power supply, an internal power supply, a boosting power supply, an operation mode specify circuit, a memory cell array, a bit line pair, a precharge potential generation circuit, an equalize circuit, a sense amplify circuit, and a potential transfer circuit.

The first power supply provides a first potential. The internal power supply receives an external power supply potential to supply a second potential that is higher than the first potential. The boosting power supply receives an external power supply potential for supplying a third potential that is higher than the second potential. The operation mode specify circuit responds to an external control signal for detecting that a self refresh mode is specified.

The memory cell array includes a plurality of memory cells arranged in a matrix. The bit line pair is provided corresponding to a memory cell column. The precharge potential generation circuit generates an equalize potential for a bit line pair. The precharge potential generation circuit responds to specification of a self refresh mode for providing an equalize potential lower than that of a normal operation mode.

The equalize circuit is provided corresponding to the bit line pair for precharging the potential level of the bit line pair to an output level of the precharge potential generation circuit. Each of sense amplify circuits is provided corresponding to the bit line pair, and includes first and second sense nodes.

Each sense amplify circuit renders the respective potential levels of the first and second sense nodes coupled to a corresponding bit line pair to the first and second potentials complimentarily.

A plurality of potential transfer circuits couple the bit line pair corresponding to the selected column to the corresponding first and second sense nodes according to an externally applied address signal. Each potential transfer circuit down-converts the second potential level by a predetermined level out of the potential levels of the first and second sense nodes to transfer the down-converted potential to a corresponding bit line during the specification of a self refresh mode.

According to another aspect of the present invention, a semiconductor memory device having a self refresh mode includes a first power supply, an internal power supply, a boosting power supply, an operation mode specify circuit, a memory cell array, a bit line pair, a precharge potential generation circuit, an equalize circuit, a sense amplify circuit, and a potential transfer circuit.

The first power supply provides a first potential. The internal power supply receives an external power supply potential to supply a second potential higher than the first potential. The boosting power supply receives an external power supply potential to supply a third potential higher than the second potential. The operation mode specify circuit detects that a self refresh mode is specified according to an externally applied control signal.

The memory cell array includes a plurality of memory cells arranged in a matrix. A bit line pair is provided corresponding to a memory cell column. The precharge potential generation circuit generates an equalize potential for the bit line pair. The precharge potential generation circuit provides an equalize potential that is lower than that of a normal operation when a self refresh mode is specified.

The equalize circuit is provided corresponding to a bit line pair, and precharges the potential level of the bit line pair to the output level of the precharge potential generation circuit.

A plurality of sense amplify circuits are provided in common to at least two bit line pairs, and include first and second sense nodes.

Each sense amplify circuit sets respective potentials of the first and second sense nodes coupled to a corresponding bit line pair complimentarily to first and second potentials according to the information retained in a selected memory cell.

A plurality of bit line select circuits selectively couple a bit line pair corresponding to a selected column to corresponding first and second sense nodes according to an externally applied address signal.

Each bit line select circuit down-converts the second potential level by a predetermined level of the potential levels of the first and second sense nodes to transfer the down-converted potential to a corresponding bit line during specification of a self refresh mode.

The main advantage of the present invention is that the self refresh cycle time can be increased since the precharge potential applied to a bit line pair is lower than the level of a normal operation in a self refresh mode.

Another advantage of the present invention is that power consumption during a self refresh mode period is reduced since the second potential level of the potentials level of the sense nodes of the sense amplify circuit is down-converted and transferred so that the H level of a bit line pair rises only to the level of the second potential during a self refresh period.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The structure of a semiconductor memory device 1000 according to a first embodiment of the present invention differs in structure from the conventional semiconductor memory device 2000 shown in FIG. 10 in the following features.

The first feature is that precharge potential generation circuit 1052 in power supply circuit 1050 alters the output potential level according to a self refresh mode specify signal /SREF that is activated upon clock generation circuit 1022 detecting that a self refresh mode is specified according to an external control signal that will be described afterwards.

More specifically, precharge potential generation circuit 1052 provides a potential of ½ the internal power supply potential Vcca as precharge potential $V_{BL}$ when a self refresh mode is not specified, i.e., when in a normal operation mode.

When in a self refresh mode, precharge potential generation circuit 1052 provides a potential that is lower than ½ internal power supply potential Vcca as precharge potential $V_{BL}$.

The second feature is that memory cell array 1034 is divided into a plurality of blocks, and that the sense amplifier is shared in common by at least two bit line pairs respectively belonging to adjacent blocks. In this structure, an internal drive circuit 1056 in sense amplifier+input/output control circuit 1038 receives a boosted potential Vpp and internal power supply potential Vcca output from internal power supply circuit 1054 to output a signal BLI that is applied to the gate of a block select transistor that is provided for selectively opening/closing the connection between a bit line pair and a sense amplifier SA. Particularly, internal drive circuit 1056 is characterized in that the output potential level is altered as set forth in the following according to whether or not in a self refresh mode.

When a self refresh mode is not specified, i.e. when in a normal operation mode, internal drive circuit 1056 outputs a boosted potential Vpp as signal line BLI.

In contrast, when in a self refresh mode, internal drive circuit 1056 provides internal power supply potential Vcca as signal BLI.

Figure 10:
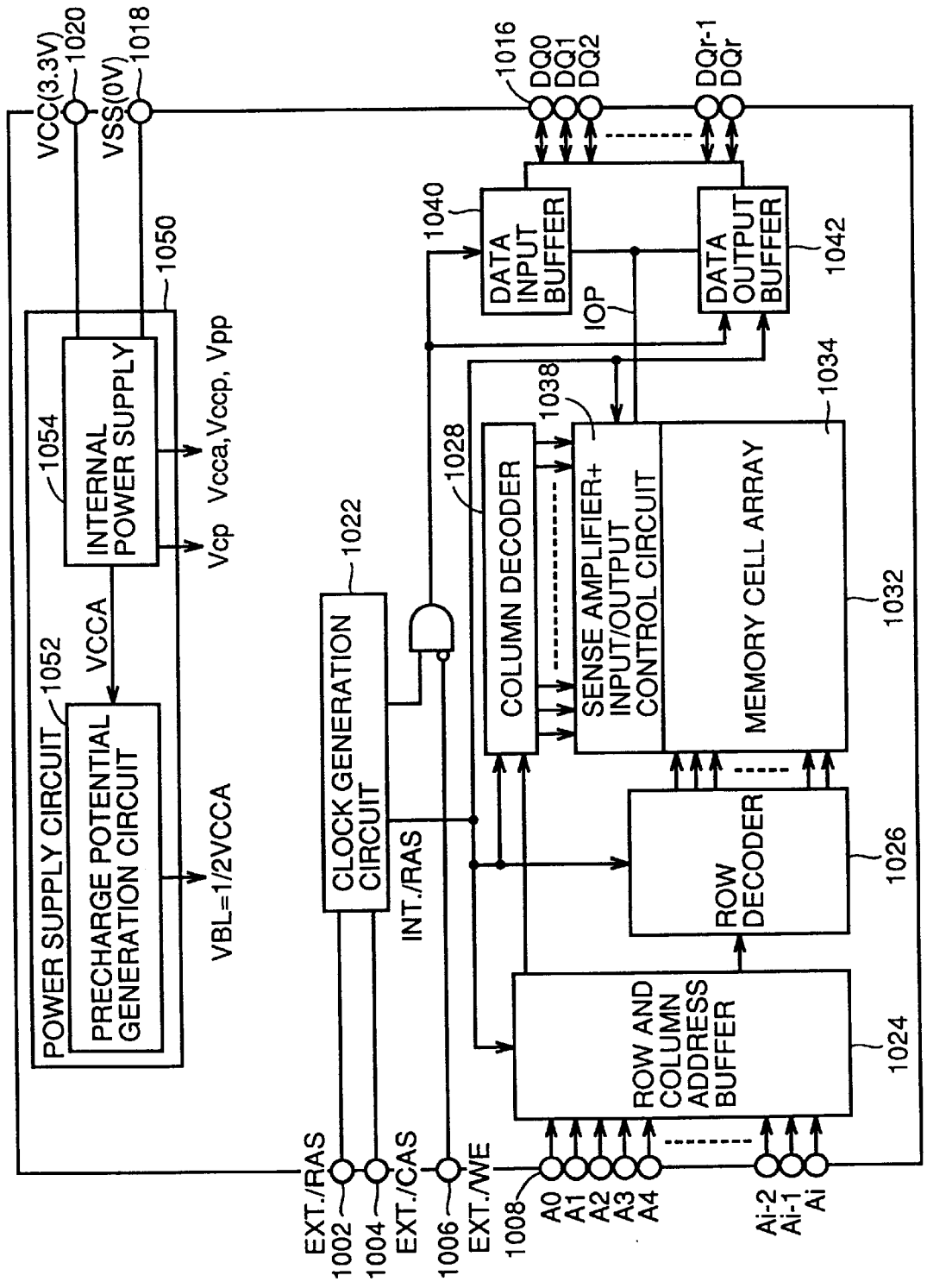
FIG. 10 is a schematic block diagram for describing a structure of a conventional semiconductor memory device 2000.

The remaining features are similar to those of the conventional semiconductor memory device 2000 shown in FIG. 10. Corresponding components have the same reference characters allotted, and their description will not be repeated.

Figure 1:
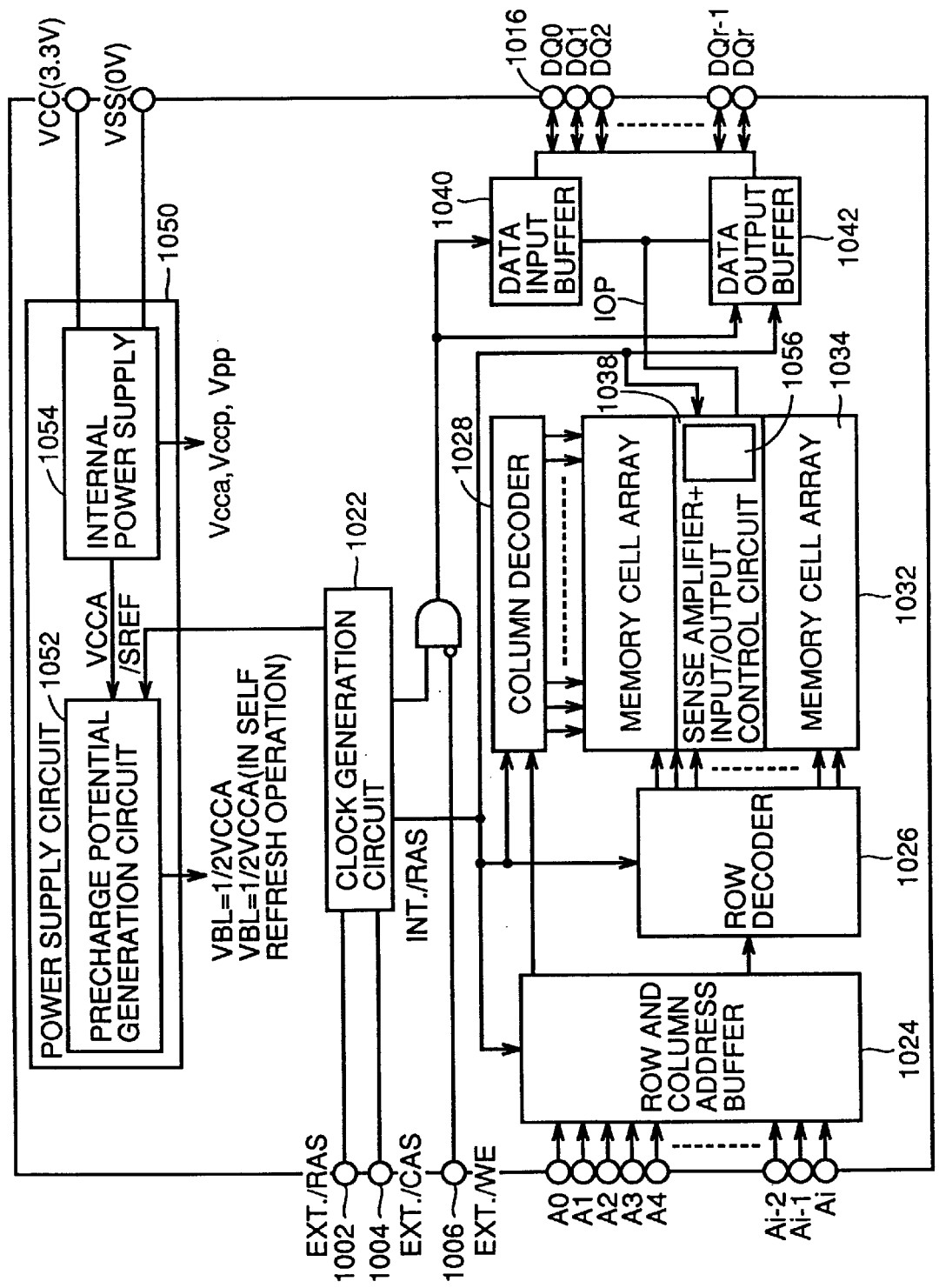
FIG. 1 is a schematic block diagram showing a structure of a semiconductor memory device 1000 according to a first embodiment of the present invention.
Figure 2:
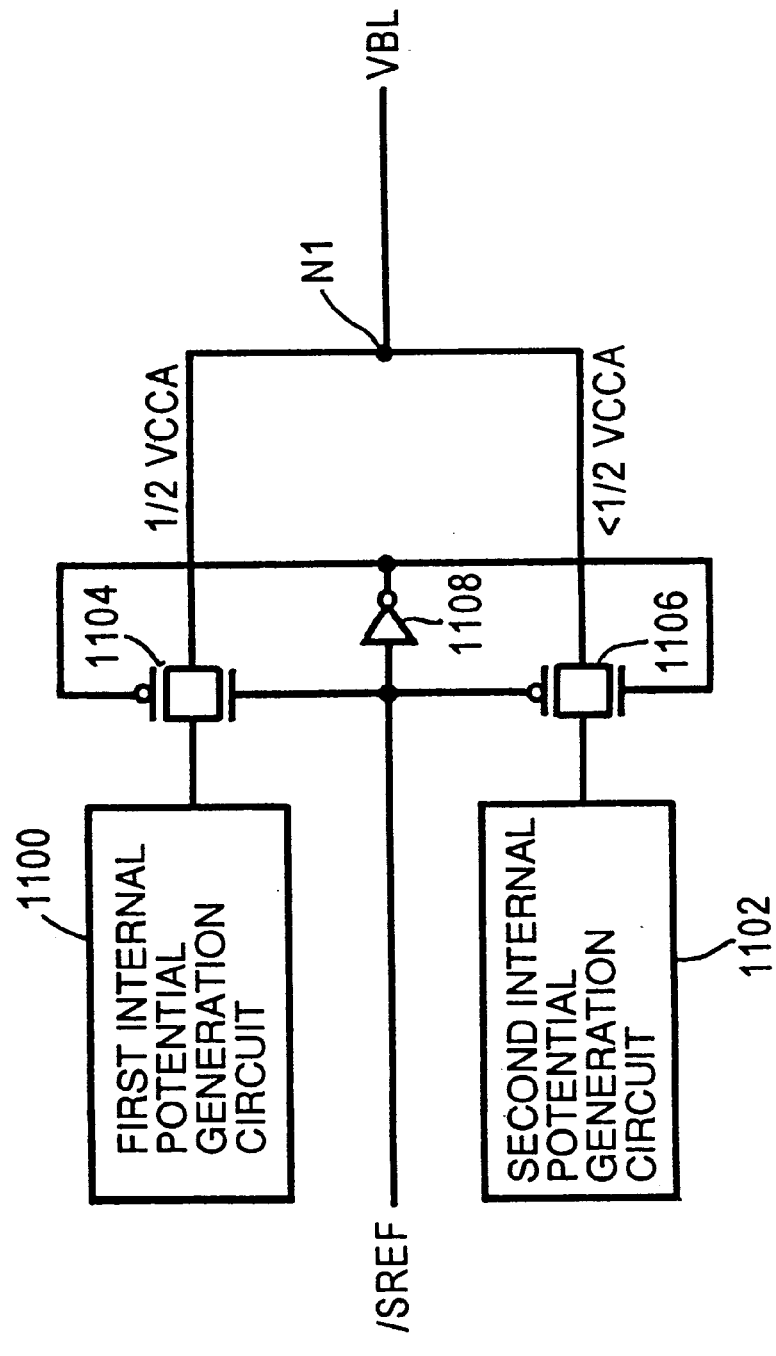
FIG. 2 is a schematic block diagram showing a structure of a precharge potential generation circuit 1052.

FIG. 2 is a schematic block diagram showing a structure of precharge potential generation circuit 1052 of FIG. 1.

Precharge potential generation circuit 1052 includes a first internal potential generation circuit 1100 receiving an internal power supply potential Vcca and a ground potential Vss for providing a potential of ½ internal power supply potential Vcca, a second internal power supply circuit 1102 for receiving internal power supply potential Vcca and ground potential Vss for providing a potential of a level lower than ½ internal power supply potential Vcca, an inverter 1108 for receiving self refresh mode specify signal /SREF output from clock generation circuit 1022, a transmission gate 1104 controlled by signal /SREF and the output signal from inverter 1108 for receiving the output of first internal power supply circuit 1100, and rendered conductive in a normal operation mode, and a transmission gate 1106 under control of signal /SREF and the output signal of inverter 1108 for receiving an output of second internal power supply circuit 1102, and rendered conductive in a self refresh mode.

In a normal operation mode where a self refresh mode is not specified, the potential level of ½ internal power supply potential Vcca output from first internal power supply circuit 1100 in precharge potential generation circuit 1052 is output to output node N1 as precharge potential $V_{BL}$ via transmission gate 1104.

In a self refresh mode, the potential output from second internal power supply circuit 1102 is provided to output node N1 as precharge potential $V_{BL}$ via transmission gate 1106.

Figure 3:
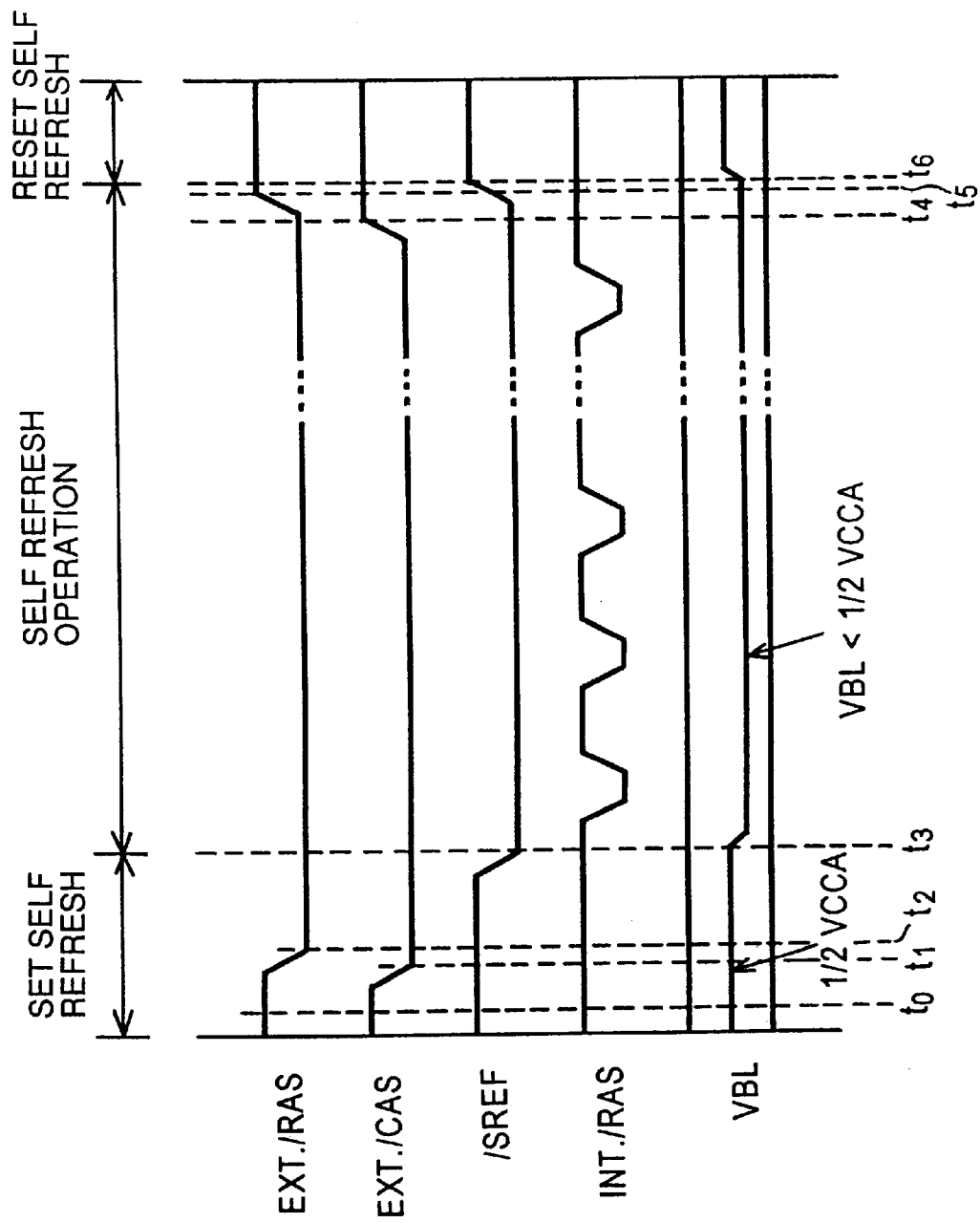
FIG. 3 is a timing chart for describing an operation of semiconductor memory device 1000.

Referring to the timing chart of FIG. 3, it is assumed that external row address strobe signal EXT./RAS and an external column address strobe signal EXT./CAS are both in an inactive state (H level) at time t0.

At time t1, external column address strobe signal EXT./CAS is driven to an active state (L level).

At time t2, external row address strobe signal EXT./RAS is driven to an active state (L level). In response, clock generation circuit 1022 detects the specification of a self refresh mode. Self refresh mode specify signal /SREF is driven to an active state (L level) at time t3.

In response, the address for carrying out self refresh is counted up by the address counter in clock generation circuit 1022. Also, an internal row address signal INT./RAS that alternates an active state and an inactive state is output at a predetermined cycle from clock generation circuit 1022.

According to an address output from this internal address counter and internal row address strobe signal INT./RAS, an operation of refreshing all memory cells simultaneously of a sequentially selected row (word line) is repeated during the self refresh mode.

At time t3, precharge potential generation circuit 1052 alters the potential level of the output precharge potential $V_{BL}$ from the level of ½ internal power supply potential Vcca to a lower potential level.

Thus, the readout margin for data of an H level is increased by setting the potential level for precharging the bit line lower than ½ internal power supply potential Vcca at the time stage prior to the sense amplifier amplifying the potential change on the bit line pair corresponding to the data stored in the selected memory cell in a self refresh mode period.

At time t4, external column address strobe signal EXT./CAS is driven to an inactive state (H level). At time t5, external row address strobe signal EXT./RAS is driven to an inactive state (H level). Accordingly, clock generation circuit 1022 renders self refresh mode specify signal /SREF inactive (H level) at time t6.

In response to this transition of signal /SREF, precharge potential generation circuit 1052 restores the potential level output as precharge potential $V_{BL}$ to the level of ½ internal power supply potential Vcca.

Figure 4:
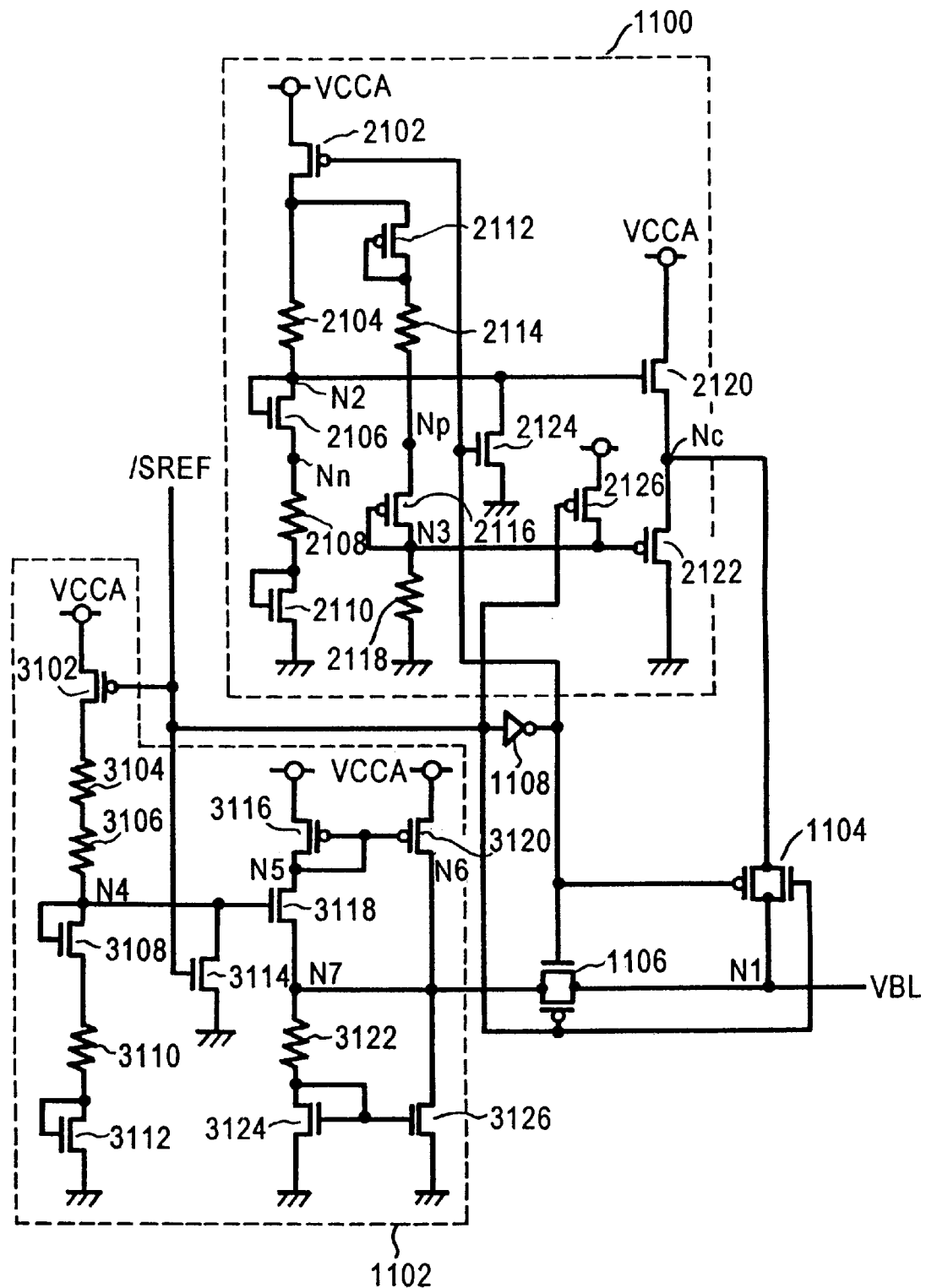
FIG. 4 is a circuit diagram for describing in further detail the structure of precharge potential generation circuit 1052.

Referring to the circuit diagram of FIG. 4 for describing details of precharge potential generation circuit 1052 of FIG. 2, a first internal potential generation circuit 1100 includes a P channel MOS transistor 2102 receiving internal power supply potential Vcca at its source, and rendered conductive in response to inactivation (transition to an H level) of signal /SREF, a resistor 2104 and an N channel MOS transistor 2106 connected in series between the drain of P channel MOS transistor 2102 and node Nn, and a resistor 2108 and an N channel MOS transistor 2110 connected in series between node Nn and ground potential.

N channel MOS transistors 2106 and 2110 are diode-connected so that respective internal power supply potentials Vcca are in the forward direction towards the ground potential.

First internal potential generation circuit 1100 further includes a P channel MOS transistor 2112 and a resistor 2114 connected in series between the drain of P channel MOS transistor 2120 and node Np, and a P channel MOS transistor 2116 and a resistor 2118 connected in series between node Np and ground potential.

P channel MOS transistors 2112 and 2116 are diode-connected so that respective internal power supply potentials Vcca are in the forward direction towards the ground potential.

First internal potential generation circuit 1100 further includes a N channel MOS transistor 2124 for coupling a node N2 to which the drain and gate of N channel MOS transistor 2106 are connected to in common to the ground potential in response to activation (transition to an L level) of signal /SREF, a P channel MOS transistor 2126 for coupling a node N3 to which the gate and drain of P channel MOS transistor 2116 are connected to in common to, power supply potential Vcca in response to activation of signal /SREF, and an N channel MOS transistor 2120 and a P channel MOS transistor 2122 connected via a node Nc in series between internal power supply potential Vcca and ground potential.

Node Nc is coupled to output node N1 via transmission gate 1104.

Figure 11:
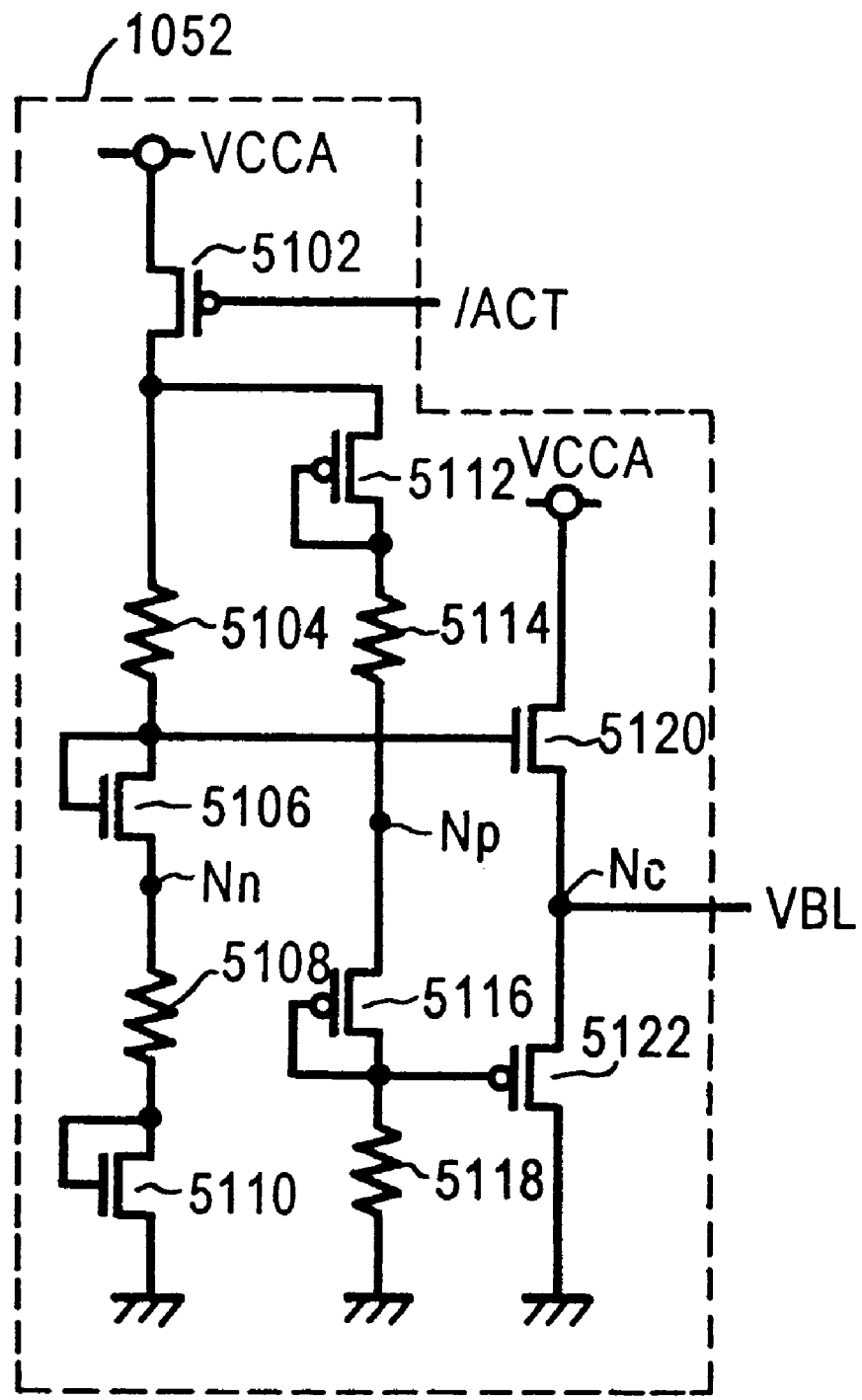
FIG. 11 is a circuit diagram for describing a structure of a conventional precharge circuit 2052.
Figure 12:
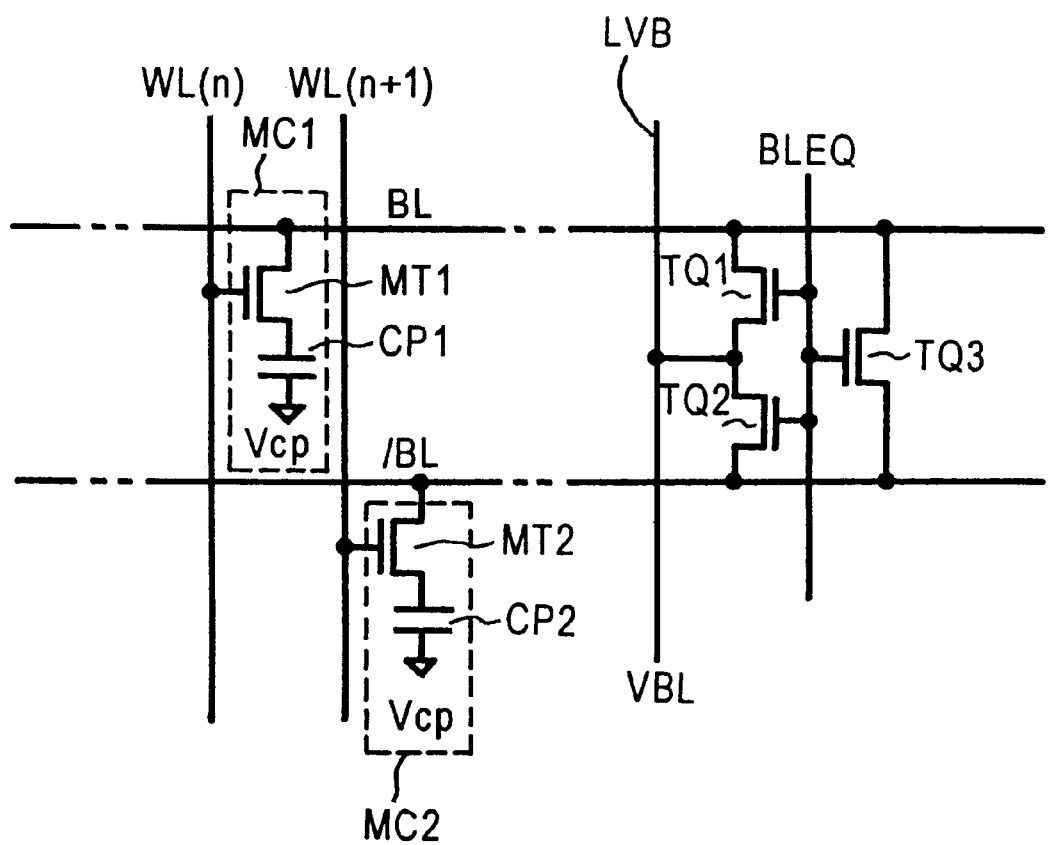
FIG. 12 is a circuit diagram for describing a structure corresponding to one column in a conventional semiconductor memory device.

Therefore, when signal /SREF is inactive, first internal potential generation circuit 1100 provides a potential of the level ½ internal power supply potential Vcca from node Nc, likewise the conventional precharge potential generation circuit 2054 described with reference to FIG. 11.

During a self refresh mode, N channel MOS transistor 2124 and P channel MOS transistor 2126 are both rendered conductive, so that the gate potentials of N channel MOS transistor 2120 and P channel MOS transistor 2122 attain the level of the ground potential and internal power supply potential Vcca, respectively. As a result, transistors 2120 and 2122 are both cut off, whereby node Nc attains a floating state.

Second internal potential generation circuit 1102 includes a P channel MOS transistor 3102 receiving internal power supply potential Vcca at its source, and rendered conductive in response to activation of signal /SREF, resistors 3104 and 3106 connected in series between the drain of P channel MOS transistor 3102 and a node N4, and an N channel MOS transistor 3108, a resistor 3110 and an N channel MOS transistor 3112 connected in series between node N4 and the ground potential.

N channel MOS transistors 3108 and 3112 are diode-connected so that respective internal power supply potentials Vcca are in a forward direction towards the ground potential.

Assuming that the resistance of resistors 3104, 3106 and 3110 are set to equal values, the potential of node N4 is lower than the potential of node N2 in first internal potential generation circuit 1100 by the connection of resistors 3104 and 3106 between the drain of P channel MOS transistor 3102 and node N4.

This means that the gate potential of N channel MOS transistor 3108 is biased so that the source thereof attains a potential level lower than ½ internal power supply potential Vcca.

Second internal potential generation circuit 1102 further includes an N channel MOS transistors 3114 that connects node N4 with ground potential in response to inactivation (transition to an H level) of signal /SREF.

Second internal potential generation circuit 1102 further includes a P channel MOS transistor 3116 connected between internal power supply potential Vcca and a node N5, and a P channel MOS transistors 3120 connected between internal power supply potential Vcca and a node N6. P channel MOS transistors 3116 and 3120 have their gates connected in common to each other. Node N5 is connected to the gates of transistors 3116 and 3120. In other words, P channel MOS transistors 3116 and 3120 form a pair to implement a current mirror circuit.

Second internal potential generation circuit 1102 includes an N channel MOS transistor 3118 connected between nodes N5 and N7, and receiving the potential of node N4 at its gate, a resistor 3122 and an N channel MOS transistor 3124 connected in series between node N7 and the ground potential, and an N channel MOS transistor 3126 connected between node N7 and the ground potential.

N channel MOS transistors 3124 and 3126 have their gates connected in common to each other. Transistor 3124 has its drain connected to the gate of transistor 3124.

More specifically, transistors 3124 and 3126 form a pair to implement a current mirror circuit.

Here it is assumed that the resistance values of resistors 3110 and 3122 are set equal.

By the above-described structure, the potential of node N7 is maintained at the potential level of the source of transistor 3108, i.e., a level lower than ½ internal power supply potential Vcca.

Node N7 is connected to output node N1 via transmission gate 1106.

By the above-described structure of precharge potential generation circuit 1052, the potential level of ½ internal power supply potential Vcca and a potential level lower than ½ internal power supply potential Vcca are output as precharge potential $V_{BL}$ when not in a self refresh mode and when in a self refresh mode, respectively.

Figure 5:
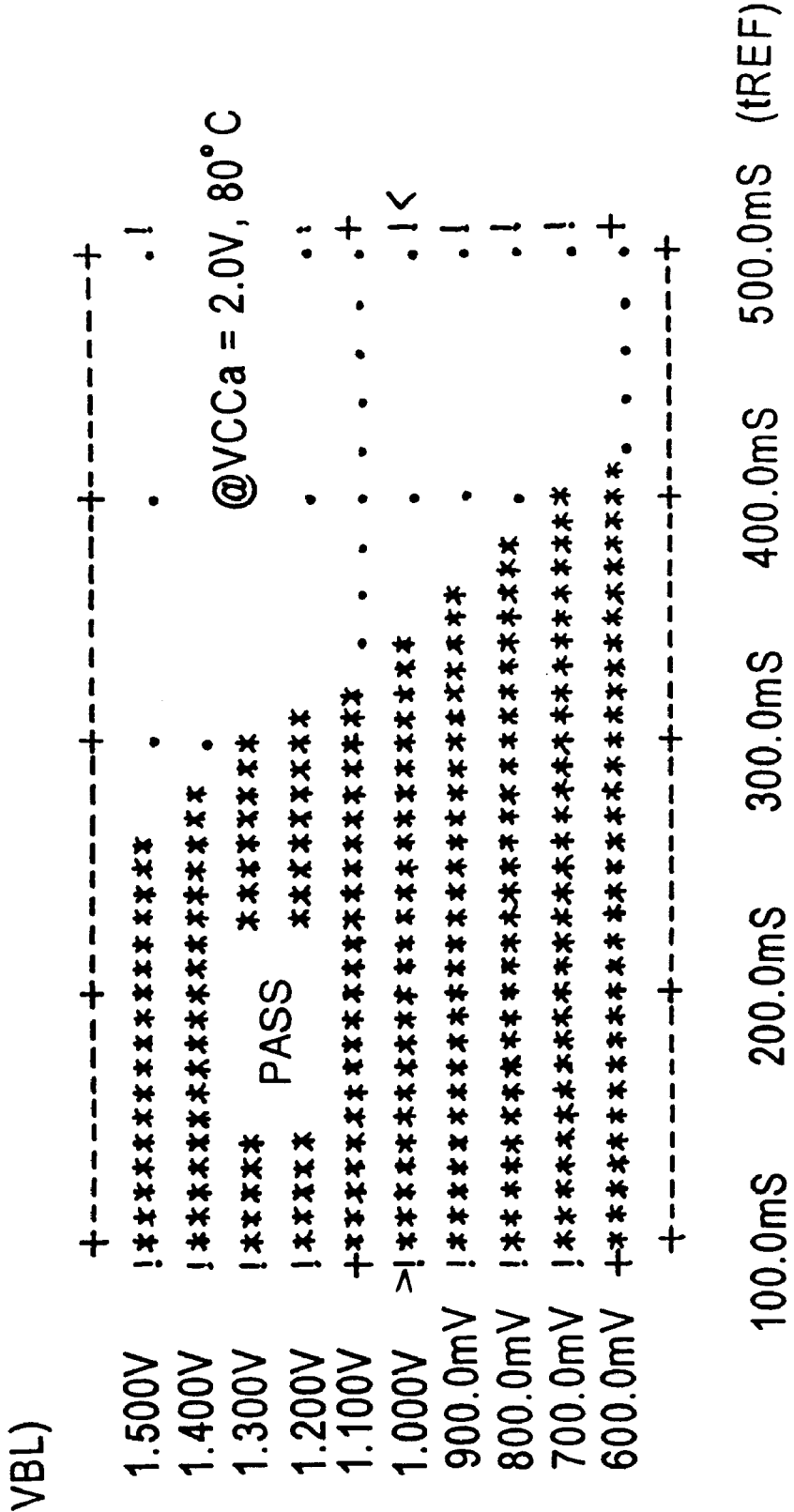
FIG. 5 is a graph showing the relationship between the self refresh cycle time and precharge potential $V_{BL}$ of semiconductor memory device 1000.

FIG. 5 is a graph showing the relationship between refresh time tREF in a self refresh mode and the level of bit line precharge potential $V_{BL}$.

Under the condition shown in FIG. 5, it is assumed that internal power supply potential Vcca is 2.0 V and the chip ambient temperature is 80° C.

In FIG. 5, the range indicated by * corresponds to a region where there is no error in operation. This area indicates that data is properly retained.

It is appreciated from FIG. 5 that the self refresh cycle time can be increased from approximately 260 mS to approximately 410 mS by lowering precharge potential $V_{BL}$ from 1.5 V down to 600 mV.

By increasing the self refresh cycle time, power consumption in a self refresh mode can be reduced.

Figure 6:
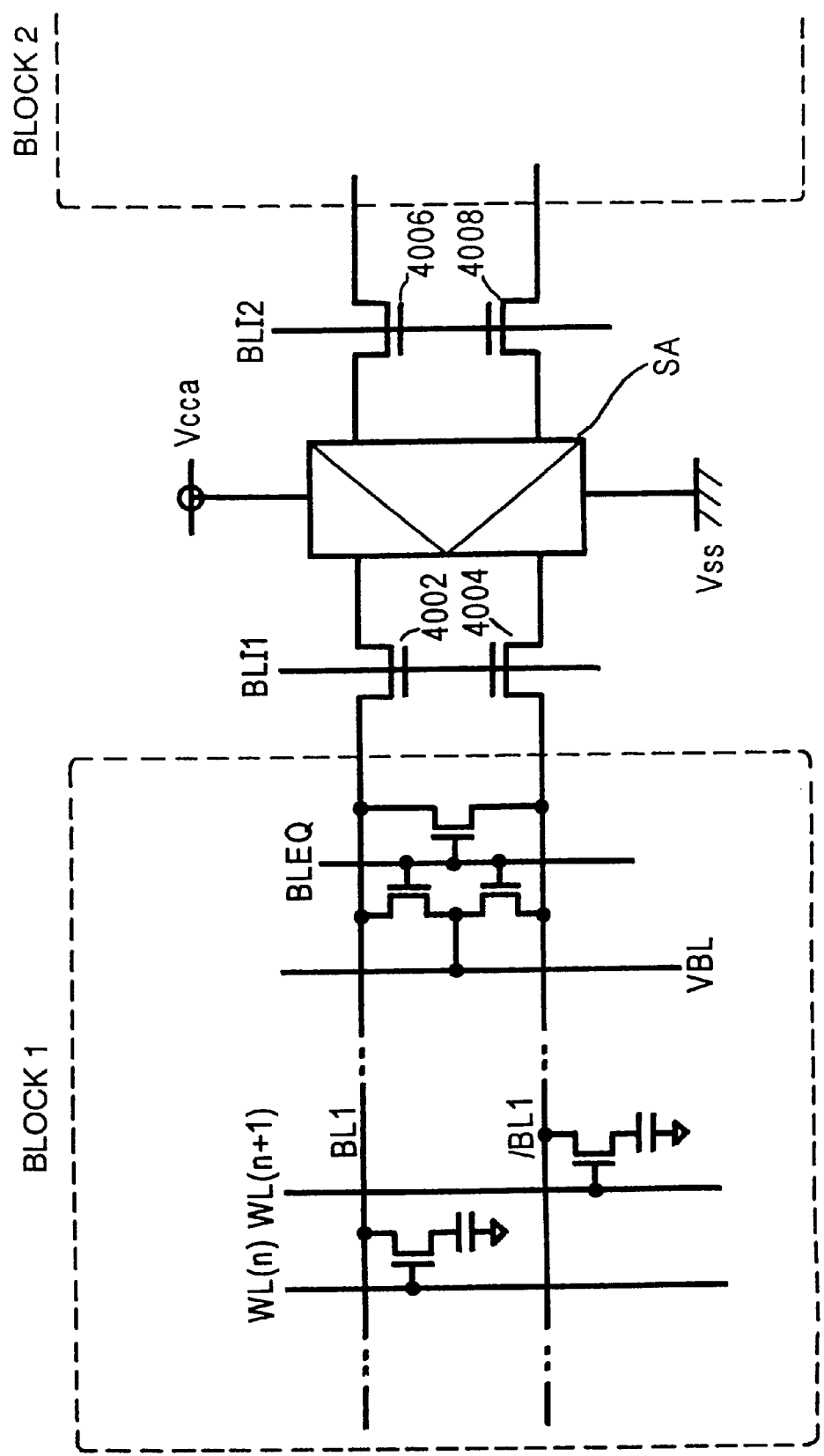
FIG. 6 is a circuit diagram for describing in further detail a structure corresponding to one column of a memory cell array 1034 according to the first embodiment of the present invention.

The details of the structure of one memory cell column in DRAM 1000 of FIG. 1 with a portion omitted is shown in FIG. 6.

In the structure shown in FIG. 6, sense amplifier SA is provided in common to a bit line pair BL1 and /BL1 in block 1 and a bit line pair BL2 and /BL2 in block 2 of memory cell array 1034.

More specifically, a structure is provided in which a bit line pair of the block at the side of the selected memory cell is selectively coupled to sense amplifier SA according to an externally applied address signal.

The coupling between bit lines BL1 and /BL1 and sense amplifier SA is effected via gate transistors (block select transistor) 4002 and 4004. The connection between sense amplifier SA and bit line pair BL2 and /BL2 of the side of block 2 is effected via gate transistors 4006 and 4008.

When bit line pair BL1 and /BL1 is selected according to an externally applied address signal, signal BLI1 output from internal drive circuit 1056 is provided to the gates of corresponding the gate transistors 4002 and 4004.

As will be described afterwards, the potential level of an active signal BLI1 (potential level of H level) is the level of boosted potential Vpp that is higher than external power supply potential Vcc. Therefore, bit line pair BL1 and /BL1 is charged up to the level of power supply potential Vcca of sense amplifier SA without the influence of the potential drop by N channel MOS transistors 4002 and 4004.

The same applies for bit line pair BL2 and /BL2.

In a self refresh mode period, the potential level of active signals BLI1 and BLI2 provided from internal drive circuit 1056 is the level of internal power supply potential Vcca.

The potential of the H level out of the complementary potential levels output from sense amplifier SA is reduced by the threshold voltage of N channel MOS transistor 4002 or 4004 to be transmitted to a corresponding bit line BL1 or /BL1.

More specifically, even when sense amplifier SA outputs complementary potentials corresponding to the level of internal power supply potential Vcca or ground potential Vss, the H level potential at the bit line side is transmitted taking a level that is lower than internal power supply potential Vcca by the threshold voltage of N channel MOS transistor 4002.

Figure 13:
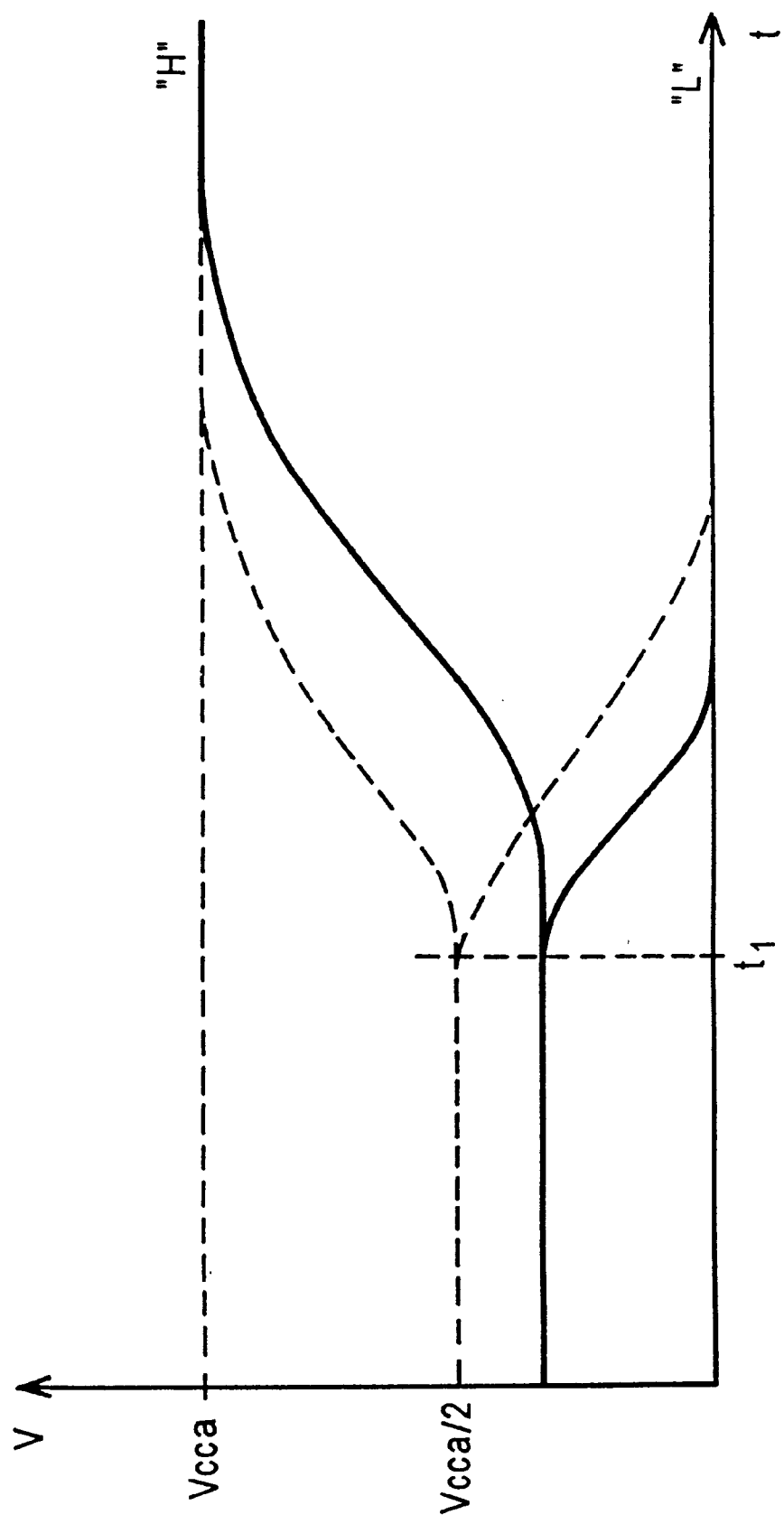
FIG. 13 is a timing chart for describing a sense amplify operation of a conventional semiconductor memory device.

Therefore, as described with reference to FIG. 13, the potential level of a H level bit line will not be charged up to the level of internal power supply potential Vcca even if bit line precharge potential $V_{BL}$ becomes lower than ½ internal power supply potential Vcca.

This means that the charging current of the bit line pair is suppressed.

Thus, amplification of the charging current for charging the bit line can be suppressed even when bit line precharge potential $V_{BL}$ is set lower than ½ internal power supply potential Vcca to increase the self refresh cycle time.

Figure 7:
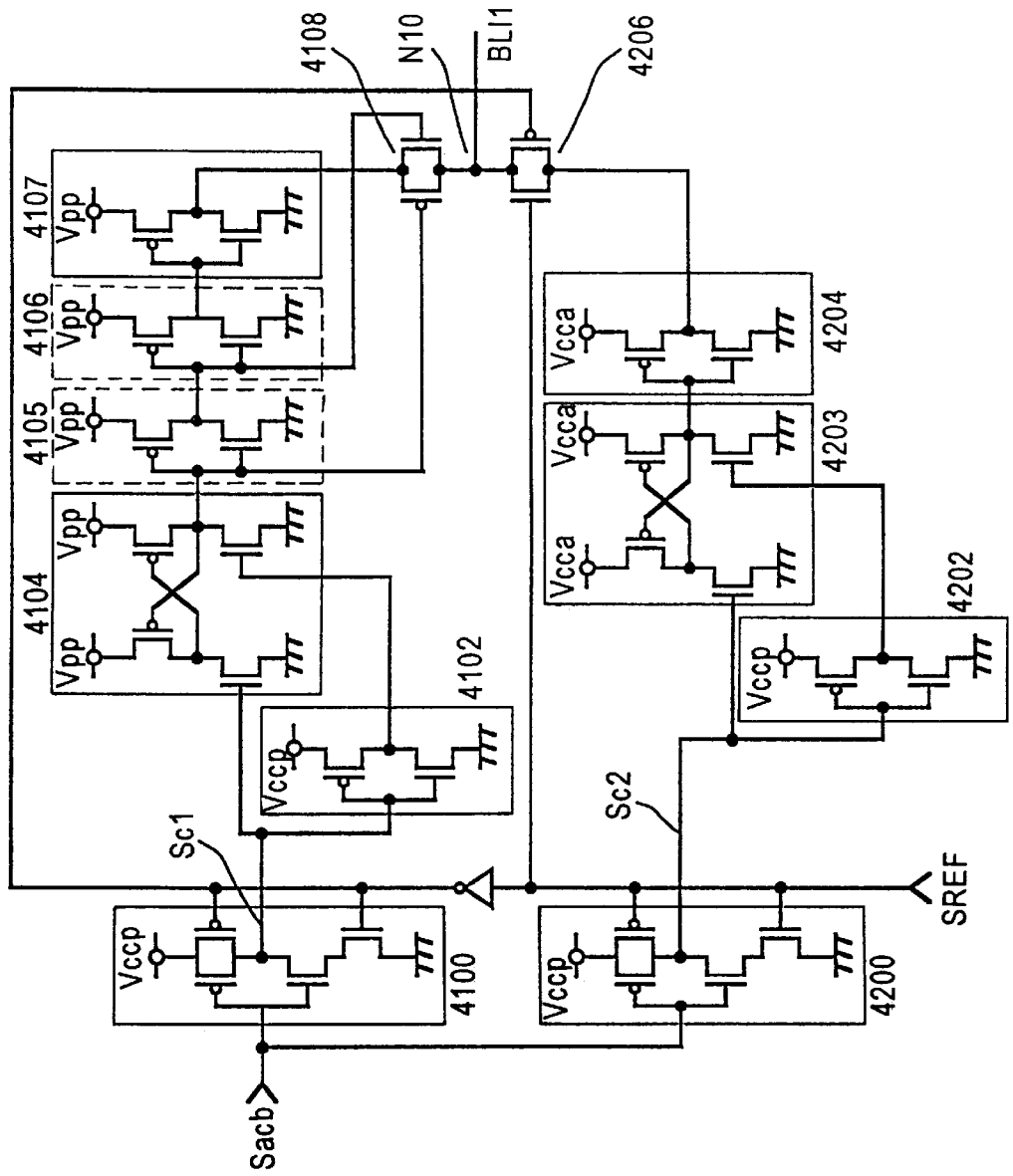
FIG. 7 is a circuit diagram for describing a structure of an internal drive circuit 1056.

The structure of internal drive circuit 1056 of FIG. 1 is shown in further detail by the circuit diagram of FIG. 7.

Internal drive circuit 1056 includes a NAND circuit 4100 having one input node receiving a BLI activation signal Sacb provided to internal drive circuit 1056 according to an external address signal for specifying activation of the output of signal BLI1 and the other input node receiving a self refresh mode activation signal /SREF, an inverter 4102 for receiving an output of NAND circuit 4100, a level conversion circuit 4104 receiving outputs of inverter 4102 and NAND circuit 4100 for providing ground potential and boosted potential Vpp when the output of NAND circuit 4100 is at an H level and at an L level, i.e. the output of inverter 4102 is at an H level (potential Vcca), respectively, and an inverter train including an inverter 4105 receiving and inverting the output of level converter circuit 4104 for output, an inverter 4106 outputting the inverted level of the output of inverter 4105 and an inverter 4107 outputting the inverted level of the output of inverter 4106.

NAND circuit 4100 and inverter 4102 operate by internal power supply potential Vccp and ground potential Vss while level conversion circuit 4104, inverters 4105, 4106 and 4107 do by boosted potential Vpp and ground potential Vss.

When signal /SREF is inactive (H level) during a period other than the self refresh mode, ground potential Vss or boosted potential Vccp is output from inverter 4106 according to the level of BLI activation signal Sacb.

Internal drive circuit 1056 further includes a NAND circuit 4200 having one input node receiving a BLI activation signal and the other input node receiving signal SREF which is an inverted version of self refresh mode activation signal /SREF, an inverter 4202 for receiving an output of NAND circuit 4200, a level conversion circuit 4203 receiving outputs of inverter 4202 and NAND circuit 4200 for providing ground potential and internal power supply potential vcca when the output of NAND circuit 4200 is at an H level and at an L level, i.e. the output of inverter 4202 is at an H level (potential Vccp), respectively, and an inverter 4204 receiving and inverting the output of level converter circuit 4203 for output.

NAND circuit 4200 and inverter 4202 operate by internal power supply potential Vccp and ground potential Vss while level conversion circuit 4203 and inverter 4204 do by internal power supply potential Vcca and ground potential.

More specifically, when signal SREF is at an H level, i.e. in a self refresh mode, inverter 4204 provides a signal of internal power supply potential Vcca or ground potential Vss level according to the level of the BLI activation signal.

Internal drive circuit 1056 further includes a transmission gate 4108 for receiving and transmitting to an output node N10 the output of inverter 4106 in a normal operation mode, and a transmission gate 4206 for receiving and transmitting to output node N1O the output of inverter 4202 in a self refresh mode.

According to the above structure, the potential level of an active signal BLI1 corresponds to the level of boosted potential Vpp and internal power supply potential Vcca when in a normal operation mode and in a self refresh mode, respectively.

In a self refresh mode, the potential of the H level out of bit lines BL1 and /BL1 rises only to the level of internal power supply potential Vcca. Therefore, power consumption is further reduced during a self refresh mode by a lower charging current of the bit line.

Second Embodiment

Figure 8:
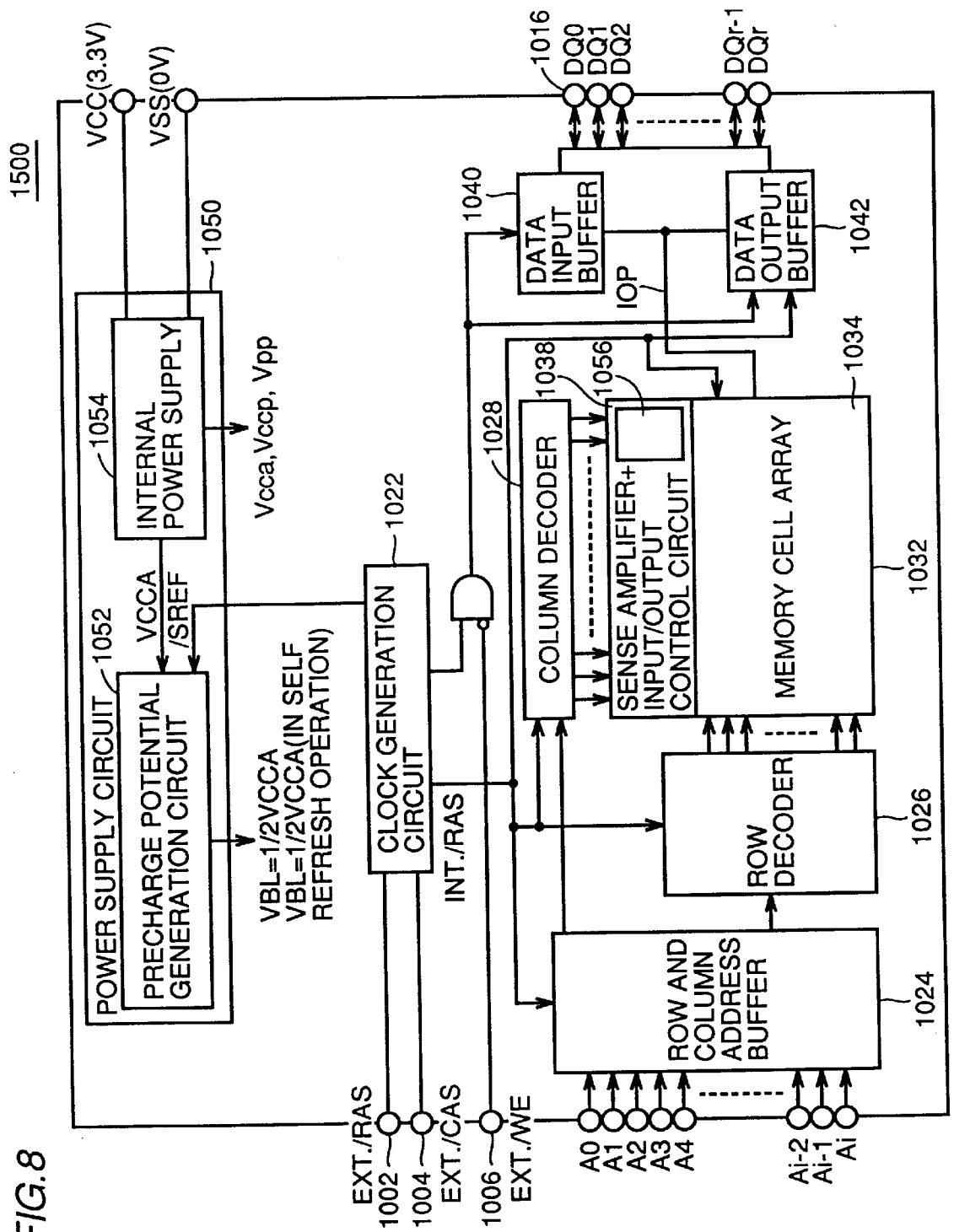
FIG. 8 is a schematic block diagram showing a structure of a semiconductor memory device 1500 according to a second embodiment of the present invention.

FIG. 8 is a block diagram showing a schematic structure of a semiconductor memory device 1500 according to a second embodiment of the present invention. In contrast to semiconductor memory device 1000 of the first embodiment in which the sense amplifier is provided in common to at least two bit line pairs, semiconductor memory device 1500 of the present second embodiment does not have the sense amplifier shared by a plurality of bit line pairs.

The remaining components of semiconductor memory device 1500 are similar to those of semiconductor memory device 1000 shown in FIG. 1. Corresponding components have the same reference characters allotted, and their description will not be repeated.

Figure 9:
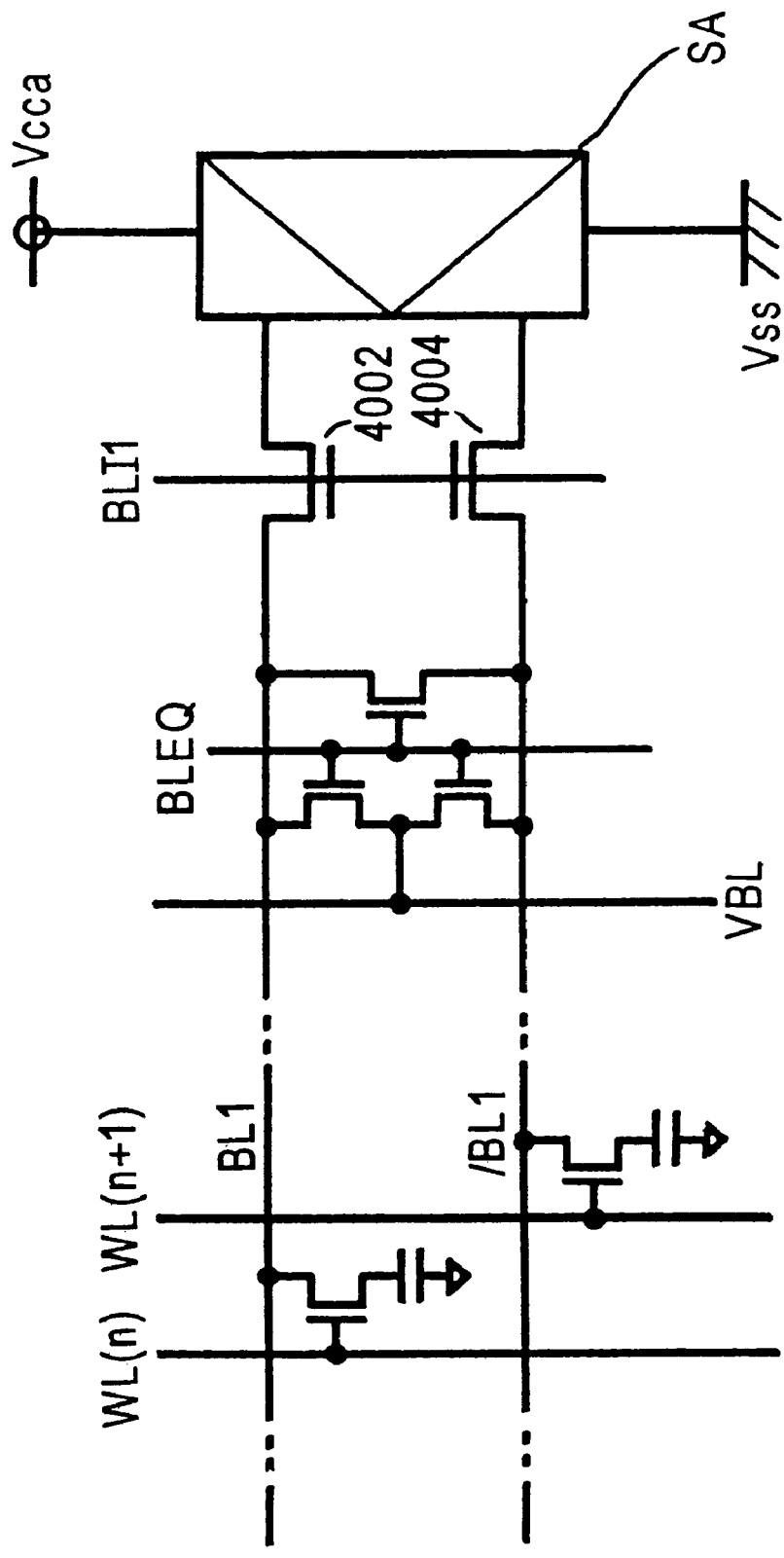
FIG. 9 is a circuit diagram for describing in further detail a structure corresponding to one column in a memory cell array 1034 according to the second embodiment.

FIG. 9 is a circuit block diagram showing in detail the structure of one memory cell row of the structure of DRAM 1500 of FIG. 8.

Referring to FIG. 9, sense amplifier SA is provided corresponding to bit line pair BL1 and /BL1 in block 1 of memory cell array 1034.

The coupling between bit lines BL1 and /BL1 and sense amplifier SA is effected via gate transistors (block select transistor) 4002 and 4004.

When bit line pair BL1 and /BL1 is selected according to the control of an external address signal and clock generation circuit 1022, signal BLI1, for example, output from internal drive circuit 1056 is provided to the gates of corresponding gate transistors 4022 and 4044.

In a normal operation mode, the potential level of an active signal BLI1 corresponds to potential Vpp that is boosted higher than external power supply potential Vcc. Therefore, the potential of bit line pair BL1 and /BL1 is charged to the level of power supply potential Vcca of sense amplifier SA without the influence of the potential drop by N channel MOS transistors 4002 and 4004.

In a self refresh mode, signal BLI1 provided from internal drive circuit 1056 corresponds to the level of internal power supply potential Vcca.

The H level potential out of the complementary potential levels provided from sense amplifier SA is lowered by the threshold voltage of N channel MOS transistor 4002 or 4004 to be transmitted to a corresponding bit line BL1 or /BL1.

Even when sense amplifier SA provides complementary potentials of the level of internal power supply potential Vcca or ground potential Vss, the potential level of an H level at the side of the bit line pair is transmitted having the potential level that is lower than internal power supply potential Vcca by the threshold voltage of N channel MOS transistor 4002.

Similar to semiconductor memory device 1000 of the first embodiment, amplification of the charging current for charging the bit line is suppressed even when bit line precharge potential $V_{BL}$ is set lower than ½ internal power supply potential Vcca to increase the self refresh cycle time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a self refresh mode, comprising:

a first power supply for supplying a first potential, an internal power supply receiving an external power supply potential for supplying a second potential higher than said first potential, a boosting power supply for receiving an external power supply potential for supplying a third potential higher than said second potential, operation mode specify means for detecting that said self refresh mode is specified according to an externally applied control signal, a memory cell array including a plurality of memory cells arranged in a matrix, a plurality of bit line pairs, each provided corresponding to a column of memory cells, precharge potential generation means for generating an equalize potential of said bit line pair, said precharge potential generation means providing an equalize potential lower than the potential of a normal operation in response to specification of said self refresh mode, a plurality of equalize means, each provided corresponding to said bit line pair for precharging the potential of corresponding said bit line pair to the output level of said precharge potential generation means, a plurality of sense amplify means, each provided corresponding to said bit line pair, and including first and second sense nodes, each sense amplify means setting respective potential levels of said first and second sense nodes coupled to a corresponding bit line pair to said first and second potentials complimentarily according to information stored in a selected memory cell, and a plurality of potential transfer means, each provided corresponding to said bit line pair for selectively coupling a bit line pair corresponding to a selected column and corresponding said first and second sense nodes according to an externally applied address signal, each potential transfer means down-converting the level of said second potential out of the potential levels of said first and second sense nodes by a predetermined amount and transferring the down-converted potential to a corresponding bit line during a period where said self refresh mode is specified.

2. The semiconductor memory device according to claim 1, wherein said potential transfer means comprises a pair of N channel MOS transistors for opening and closing connection between said sense amplify means and said corresponding bit line pair, said semiconductor memory device further comprise drive potential generation means for driving said N channel MOS transistor at said third potential when in a normal operation mode and at said second potential when in said self refresh mode.

3. The semiconductor memory device according to claim 1, wherein said precharge potential generation means comprises first internal potential generation means for generating a first precharge potential in the normal operation, second internal potential generation means for generating a second precharge potential lower than said first precharge potential at the self refresh mode, and first switching means receiving outputs of said first and second internal potential generation means for selectively providing either output according to a detected result of said operation mode specify means.

4. The semiconductor memory device according to claim 3, wherein said first precharge potential is a fourth potential that is intermediate between said first potential and said second potential, wherein said first internal potential generation means comprises
  a first N channel MOS transistor coupled between said first potential and said second potential, and having a gate potential biased so that a source potential attains said fourth potential,
  a first P channel MOS transistor coupled between said first potential and said second potential, and having a gate potential biased so that a source potential attains said fourth potential, and
  a third P channel MOS transistor and a third N channel MOS transistor connected in series between said first and second potentials, and so that respective sources are connected at a connection node,
  wherein said third P channel MOS transistor receives said first potential at its drain and has a gate receiving the gate potential of said first P channel MOS transistor,
    wherein said third N channel MOS transistor receives said second potential at its drain and has a gate receiving the gate potential of said first N channel MOS transistor,
  wherein the connection node of said third P channel MOS transistor and said third N channel MOS transistor provides said first precharge potential,
  wherein said second internal potential generation means comprises
    a fourth N channel MOS transistor coupled between said first potential and said second potential, and having a gate potential biased so that a source potential attains a fifth potential that is lower than said fourth potential,
  a first current mirror circuit receiving said second potential for supplying a current corresponding to the current flowing through said fourth N channel MOS transistor to first and second internal nodes respectively,
  a fifth N channel MOS transistor having a gate receiving the gate potential of said fourth N channel MOS transistor, and having a drain connected to said first internal node, and
  a second current mirror circuit provided for controlling a first current flowing from a source of said fifth N channel MOS transistor to said first potential and a second current flowing from said second internal node to said first potential,
wherein said second internal node provides said second precharge potential.

5. The semiconductor memory device according to claim 2, wherein said drive potential generation means comprises internal control means for activating a first control signal in said normal operation mode and a second control signal in said self refresh mode in a select operation of said potential transfer means, level conversion means for providing a signal of said third potential according to activation of said first control signal, internal drive means for providing a signal of said second potential according to activation of said second control signal, and second switching means receiving an output of said level conversion means and an output of said internal drive means for selectively providing an output.

6. A semiconductor memory device having a self refresh mode, comprising:

a first power supply for supplying a first potential, an internal power supply receiving an external power supply potential for supplying a second potential higher than said first potential, a boosting power supply receiving an external power supply potential for supplying a third potential higher than said second potential, operation mode specify means for detecting that said self refresh mode is specified according to an externally applied control signal, a memory cell array including a plurality of memory cells arranged in a matrix, a plurality of bit line pairs, each provided corresponding to a column of memory cells, precharge potential generation means for generating an equalize potential of said bit line pair, said precharge potential generation means providing an equalize potential lower than the potential of a normal operation according to specification of said self refresh mode, a plurality of equalize means, each provided corresponding to said bit line pair for precharging a potential level of said corresponding bit line pair to an output level of said precharge potential generation means, a plurality of sense amplifying means, each provided in common to at least two of said bit line pairs, and having first and second sense nodes, each sense amplify means setting respective potential levels of said first and second sense nodes coupled to a corresponding bit line pair to said first and second potentials complementarily according to information held in a selected memory cell, and a plurality of bit line select means, each provided corresponding to said bit line pair for coupling a bit line pair corresponding to a selected column and a corresponding said first and second sense nodes according to an externally applied address signal, each bit line select means down-converting said second potential level out of potential levels of said first and second sense nodes by a predetermined level during a period of specification of said self refresh mode.

7. The semiconductor memory device according to claim 6, wherein said bit line select means comprises a pair of N channel MOS transistors for opening and closing connection between said sense amplify means and said corresponding bit line pair, said semiconductor memory device further comprises drive potential generation means for driving said N channel MOS transistor at said third potential in a normal operation mode and at said second potential in said self refresh mode.

8. The semiconductor memory device according to claim 6, wherein said precharge potential generation means comprises first internal potential generation means for generating a first precharge potential at the normal operation, second internal potential generation means for generating a second precharge potential lower than said first precharge potential at said self refresh mode, and first switching means receiving outputs of said first and second internal potential generation means for selectively providing either output according to a detected result of said operation mode specify means.

9. The semiconductor memory device according to claim 8, wherein said first precharge potential is a fourth potential that is intermediate between said first potential and said second potential, wherein said first internal potential generation means comprises a first N channel MOS transistor coupled between said first potential and said second potential, and having a gate potential biased so that a source potential attains said fourth potential, a first P channel MOS transistor coupled between said first potential and said second potential, and having a gate potential biased so that a source potential attains said fourth potential, and a third P channel MOS transistor and a third N channel MOS transistor connected in series between said first and second potentials, and so that respective sources are connected at a connection node, wherein said third P channel MOS transistor receives said first potential at its drain and has a gate receiving the gate potential of said first P channel MOS transistor, wherein said third N channel MOS transistor receives said second potential at its drain and has a gate receiving the gate potential of said first N channel MOS transistor, wherein said first precharge potential is output from the connection node of said third P channel MOS transistor and said third N channel MOS transistor, wherein said second internal potential generation means comprises a fourth N channel MOS transistor coupled between said first potential and said second potential, and having a gate potential biased so that a source potential attains a fifth potential that is lower than said fourth potential, a first current mirror circuit receiving said second potential for supplying a current corresponding to the current flowing through said fourth N channel MOS transistor to first and second internal nodes respectively, a fifth N channel MOS transistor having a gate receiving the gate potential of said fourth N channel MOS transistor, and having a drain connected to said first internal node, and a second current mirror circuit provided for controlling a first current flowing from a source of said fifth N channel MOS transistor to said first potential and a second current flowing from said second internal node to said first potential, wherein said second internal node provides said second precharge potential.

10. The semiconductor memory device according to claim 7, wherein said drive potential generation means comprises internal control means for activating a first control signal in said normal operation mode and a second control signal in said self refresh mode in a select operation of said bit line select means, level conversion means for providing a signal of said third potential according to activation of said first control signal, internal drive means for providing a signal of said second potential according to activation of said second control signal, and second switching means receiving an output of said level conversion means and an output of said internal drive means for selectively providing an output.

* * * * *

UNITED STATES PATENT AND TRADEMARK OFFICE
CERTIFICATE OF CORRECTION

PATENT NO. : 6,038,186
DATED : March 14, 2000
INVENTOR(S) : Tetsushi TANIZAKI

It is certified that error appears in the above-identified patent and that said Letter Patent is hereby corrected as shown below:

Column 12, Lines 49-50, change "ground potential and boosted potential" to -- boosted potential and ground potential--.

Line 52, change "Vcca" to --Vccp--.

Signed and Sealed this

Third Day of April, 2001

Attest:

NICHOLAS P. GODICI

*Attesting Officer*   Acting Director of the United States Patent and Trademark Office

UNITED STATES PATENT AND TRADEMARK OFFICE
CERTIFICATE OF CORRECTION

PATENT NO. : 6,038,186
DATED : March 14, 2000
INVENTOR(S) : Tetsushi Tanizaki

It is certified that error appears in the above-identified patent and that said Letters Patent is hereby corrected as shown below:

Column 2,
Line 26, change "column" to -- row --.
Line 32, change "1048" to -- 1042 --.

Column 12,
Lines 51-52, change "ground potential and boosted potential" to -- boosted potential and ground potential --.
Line 54, change "Vcca" to -- Vccp --.

Column 13,
Lines 8-9, change "ground potential and internal power supply potential Vcca" to -- internal power supply potential Vcca and ground potential --.
Line 24, change "4106" to -- 4107 --.
Line 26, change "4202" to -- 4204 --.

Column 15,
Line 17, change "comprise" to -- comprises --.

Column 16,
Line 60, change "amplifying" to -- amplify --.

Column 17,
Line 23, change "a" to -- the --.

Signed and Sealed this

Tenth Day of December, 2002

JAMES E. ROGAN
*Director of the United States Patent and Trademark Office*